United States Patent
Walls et al.

(10) Patent No.: US 10,424,589 B2
(45) Date of Patent: Sep. 24, 2019

(54) FLOATING GATE SPACER FOR CONTROLLING A SOURCE REGION FORMATION IN A MEMORY CELL

(71) Applicant: Microchip Technology Incorporated, Chandler, AZ (US)

(72) Inventors: James Walls, Mesa, AZ (US); Mel Hymas, Camas, WA (US); Sajid Kabeer, Tempe, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 15/983,461

(22) Filed: May 18, 2018

(65) Prior Publication Data

US 2019/0252395 A1    Aug. 15, 2019

Related U.S. Application Data

(60) Provisional application No. 62/630,051, filed on Feb. 13, 2018.

(51) Int. Cl.
*H01L 21/225* (2006.01)
*H01L 21/266* (2006.01)
(Continued)

(52) U.S. Cl.
CPC .... *H01L 27/11521* (2013.01); *H01L 21/2253* (2013.01); *H01L 21/266* (2013.01);
(Continued)

(58) Field of Classification Search
CPC ........... H01L 27/11521; H01L 21/2253; H01L 21/266; H01L 21/28273; H01L 29/0847; H01L 29/66825; H01L 29/7884
(Continued)

(56) References Cited

U.S. PATENT DOCUMENTS 6,001,690 A * 12/1999 Chien ............... H01L 29/66825
257/E21.422
6,482,700 B2 * 11/2002 Chen ..................... H01L 27/115
257/E21.682
(Continued)

OTHER PUBLICATIONS

International Search Report and Written Opinion, Application No. PCT/US2019/017578, 11 pages, dated Apr. 8, 2019.

*Primary Examiner* — Tong-Ho Kim
(74) *Attorney, Agent, or Firm* — Slayden Grubert Beard PLLC

(57) ABSTRACT

A method is provided for forming an integrated circuit memory cell, e.g., flash memory cell. A pair of spaced-apart floating gate structures may be formed over a substrate. A non-conformal spacer layer may be formed over the structure, and may include spacer sidewall regions laterally adjacent the floating gate sidewalls. A source implant may be performed, e.g., via HVII, to define a source implant region in the substrate. The spacer sidewall region substantially prevents penetration of source implant material, such that the source implant region is self-aligned by the spacer sidewall region. The source implant material diffuses laterally to extend partially under the floating gate. Using the non-conformal spacer layer, including the spacer sidewall regions, may (a) protect the upper corner, or "tip" of the floating gate from rounding and (b) provide lateral control of the source junction edge location under each floating gate.

16 Claims, 4 Drawing Sheets

(51) Int. Cl.
    *H01L 21/28*      (2006.01)
    *H01L 27/11521*   (2017.01)
    *H01L 29/08*      (2006.01)
    *H01L 29/66*      (2006.01)
    *H01L 29/788*     (2006.01)

(52) U.S. Cl.
    CPC .... *H01L 21/28273* (2013.01); *H01L 29/0847* (2013.01); *H01L 29/66825* (2013.01); *H01L 29/7884* (2013.01)

(58) Field of Classification Search
    USPC ........................................................ 257/315
    See application file for complete search history.

(56) References Cited

U.S. PATENT DOCUMENTS

| | | | |
|---|---|---|---|
| 8,669,607 B1* | 3/2014 | Tsair ................... | H01L 29/7881 257/316 |
| 2002/0064910 A1* | 5/2002 | Chen ..................... | H01L 27/115 438/201 |
| 2011/0049603 A1 | 3/2011 | Pan et al. ....................... | 257/316 |
| 2017/0103991 A1* | 4/2017 | Kim ................. | H01L 27/11531 |

\* cited by examiner

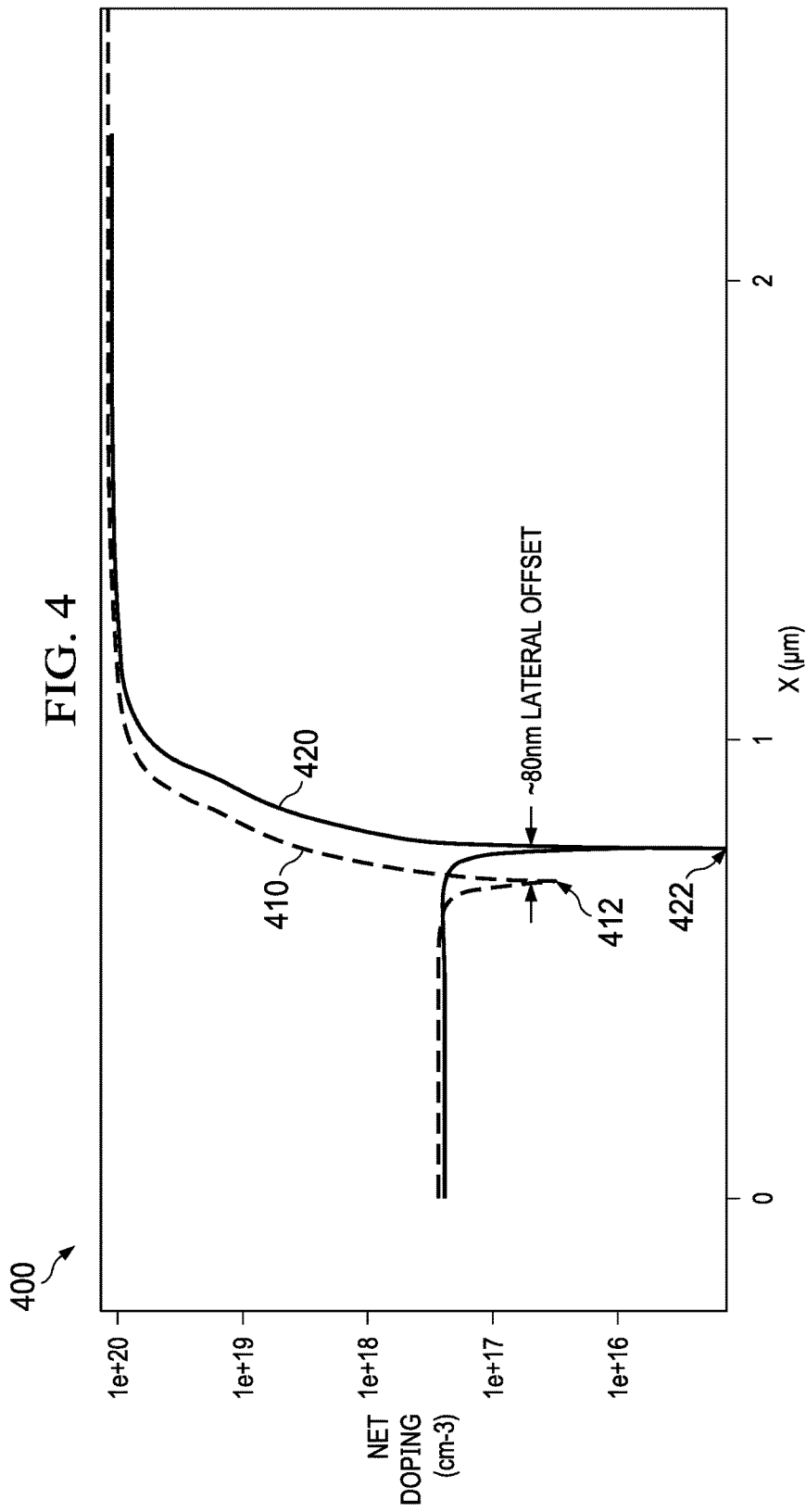

FLOATING GATE SPACER FOR CONTROLLING A SOURCE REGION FORMATION IN A MEMORY CELL

RELATED PATENT APPLICATION

This application claims priority to U.S. Provisional Patent Application No. 62/630,051 filed Feb. 13, 2018, the entire contents of which are hereby incorporated by reference for all purposes.

TECHNICAL FIELD

The present disclosure relates to semiconductor devices and manufacturing, and more particularly, to methods of using a floating gate spacer (e.g., a non-conformal, self-aligned floating gate spacer) for regulating a source region in a memory cell, and a memory cell manufactured using such methods.

BACKGROUND

Certain memory cells, including flash memory cells, include at least one floating gate that is/are programmed and erased through one or more program/erase gates, wordlines, or other conductive element(s). Some memory cells use a common program/erase gate extending over a floating gate to both program and erase the cell. Other memory cells include separate program and erase gates extending over a floating gate. In some implementations, the floating gate is formed by a Poly1 layer, while the program and erase gates (or common program/erase gate) are formed by a Poly2 layer that partially overlaps the underlying Poly1 floating gate in the lateral direction. For some memory cells, the manufacturing process includes a floating gate thermal oxidation process that forms a football-shaped oxide over the Poly 1 floating gate. Each cell may include a source region formed in the substrate, e.g., by a high voltage ion implant (HVII), which diffuses laterally beneath a portion of the floating gate.

Some memory cells, e.g., certain flash memory cells, may experience problems due to scaling. FIG. 1 shows an example memory cell structure 100 to illustrate two of such problems that may exist in certain scaled-down cells. Memory cell structure 100 may comprise a structure of a SuperFlash memory cell from Microchip Technology Inc., having a headquarters at 2355 W. Chandler Blvd., Chandler, Ariz. 85224, or modified versions of such memory cell.

Memory cell structure 100, includes two spaced-apart floating gates 104 formed over a substrate 102, with a "football oxide" 106 formed over each floating gate 106, a word line 108 formed over each floating gate 104, and a common erase gate or "coupling gate" 110 formed between and extending over both floating gates 104, and a source region 112 formed below the common erase gate. In this cell, the source region 112 may be formed before forming the word lines 108 and the coupling gate 110, e.g., by a high-voltage ion implant (HVII) of source dopant (e.g., phosphorus) through an opening in a resist layer formed over the structure, followed by an anneal process to cause a lateral diffusion of the source dopant.

In some configurations or instances, e.g., for particularly small or shrunk cells, the doped source region (e.g., phosphorus doped region) may diffuse an excessive distance laterally underneath the floating gate. Also, in some configurations or instances, during the source implant, portions of each floating gate 104 that are not masked by resist are relatively unprotected, such that a portion of the source dopant (e.g., phosphorus) may penetrate through each football oxide 106 and into each underlying floating gate 104. In particular, dopant received in the upper corners, or "tips" of the floating gate 120 (e.g., the source-side FG erase tips aligned over the source region 112) may result in an undesirable dulling or rounding of the FG tips 120 during subsequent oxidation.

FIG. 2 shows an example flash memory cell structure 200 including two floating gates 204 formed over a substrate 202, each floating gate 204 covered by a flat-topped oxide cap or "stud" region 206, and a conformal nitride layer 230 formed over the structure, e.g., having a thickness of approximately 400 Å. The flat-topped floating gate structures may be formed in any suitable manner, e.g., using the techniques disclosed in co-pending U.S. application Ser. No. 15/921,858 filed Mar. 15, 2018, the entire contents of which application are hereby incorporated by reference.

The conformal nitride layer 230 is intended to act as shield to protect against the HVII source implant dopant from penetrating down into the floating gate poly and causing a dulling or rounding of the floating gate upper corners, or tips 220 during subsequent oxidation. However, in some configurations or instances, the spacing/thickness of the conformal nitride layer 230 may be functionally coupled to the required energy level for the HVII process, as the HVII implant must travel through the nitride layer 230 extending over the substrate 202. The energy level required for an effective HVII process through the nitride layer may result in an undesired amount of lateral diffusion of the source region 212 underneath each floating gate 204.

SUMMARY

Embodiments of the invention provide a memory cell, e.g., a flash memory cell, having a non-conformal, self-aligned floating gate spacer and manufacturing methods for such memory cell. In one embodiment, a pair of spaced-apart floating gate structures may be formed over a substrate. A non-conformal spacer layer may be formed over the structure, and may include spacer sidewall regions laterally adjacent the floating gate sidewalls. A source implant may be performed, e.g., via HVII, to define a source implant region in the substrate. The spacer sidewall region substantially prevents penetration of source implant material, such that the source implant region is self-aligned by the spacer sidewall region. The source implant material diffuses laterally to extend partially under the floating gate.

The use of the non-conformal spacer layer, including the spacer sidewall regions, may (a) protect the upper corner, or "tip" of the floating gate from HVII doping, and subsequent rounding during oxidation, e.g., in memory cells configured for EG erase, and (b) provide independent lateral control of the source junction edge location under each floating gate, which may be critical to hot carrier injection (HCI) programming, for example. Further, the disclosed invention may protect the floating gate tip from HVII doping, and subsequent rounding during oxidation.

BRIEF DESCRIPTION OF THE DRAWINGS

Example aspects of the present disclosure are described below in conjunction with the figures, in which:

FIG. 4 illustrates example dopant profile simulations at the source junction edge for (a) a prior art memory cell and (b) an example memory cell formed according to the present invention, i.e., using a non-conformal layer to control the lateral extent of the source region.

DETAILED DESCRIPTION OF THE INVENTION

Embodiments of the invention provide a memory cell, e.g., a flash memory cell, having a non-conformal, self-aligned floating gate spacer and manufacturing methods for such memory cell.

Some embodiments provide a method for forming an integrated circuit memory cell, e.g., a SuperFlash or other flash memory cell, using a non-conformal floating gate spacer for self-aligning a source implant region in the substrate and controlling the post-diffusion lateral source junction edge location underneath the floating gate. In an example embodiment, a floating gate structure is formed over a substrate, and a non-conformal spacer layer is formed, which includes a spacer sidewall region laterally adjacent a sidewall of the floating gate. A source implant may then be performed, e.g., via HVII, to define a source implant region in the substrate. The spacer sidewall region may substantially prevent penetration of source implant material, such that the source implant region formed in the substrate is self-aligned by the spacer sidewall region. The source implant material is diffused laterally, e.g., by an anneal, to extend the source region partially under the floating gate. The use of the non-conformal spacer layer, including the spacer sidewall region, may (a) protect the upper corner(s), or "tip(s)" of the floating gate from rounding that may occur after source implant and subsequent oxidation using prior known techniques, and (b) provide independent lateral control of the source junction edge location under the floating gate, which may be particular advantageous in shrunk/small scale memory cells.

Figure 1:
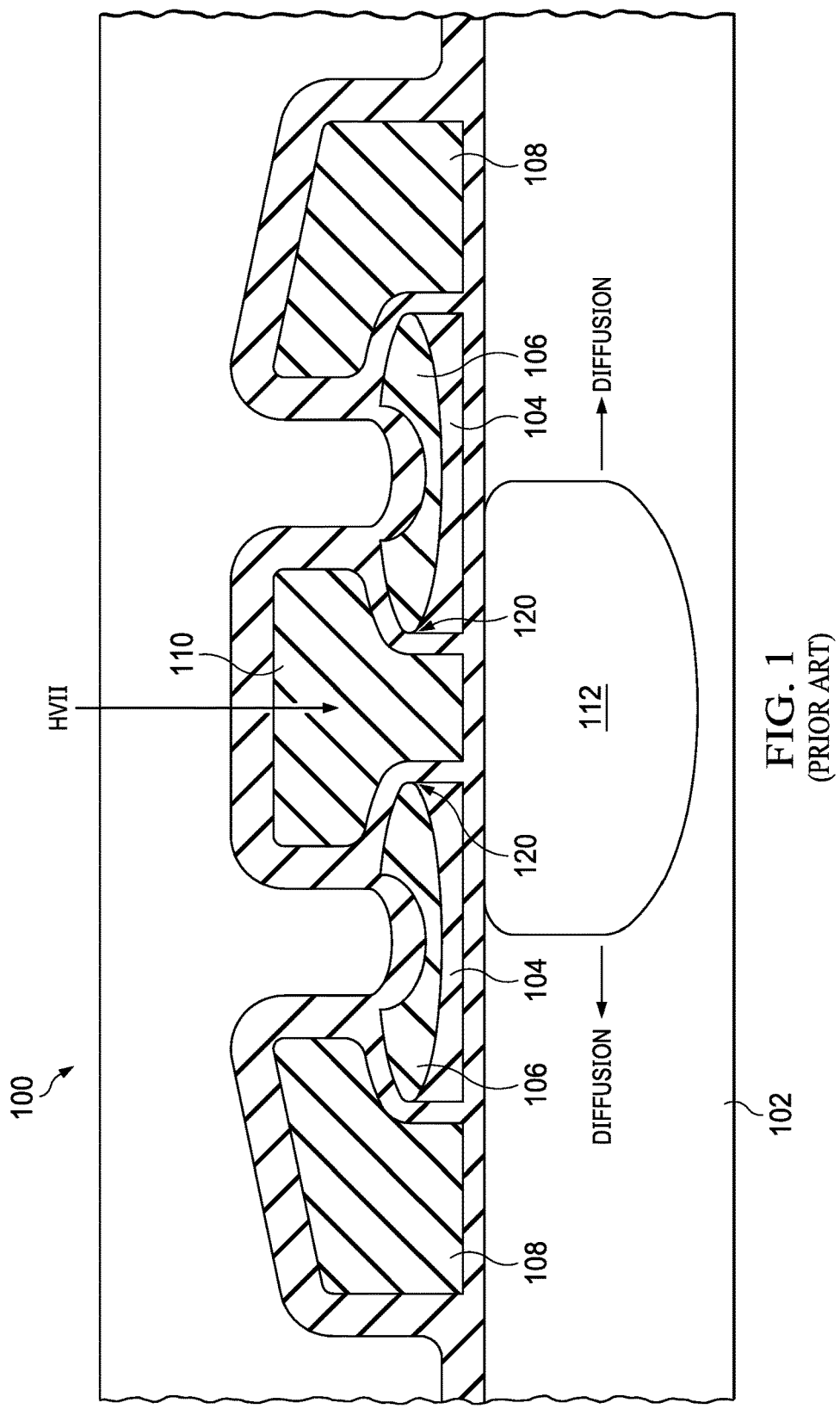
FIG. 1 illustrates example flash memory cell structure (e.g., a SuperFlash cell structure) including a pair of floating gates and a coupling gate arranged over the floating gates, and a source region is formed by a source implant delivered between the pair of floating gates.
Figure 2:
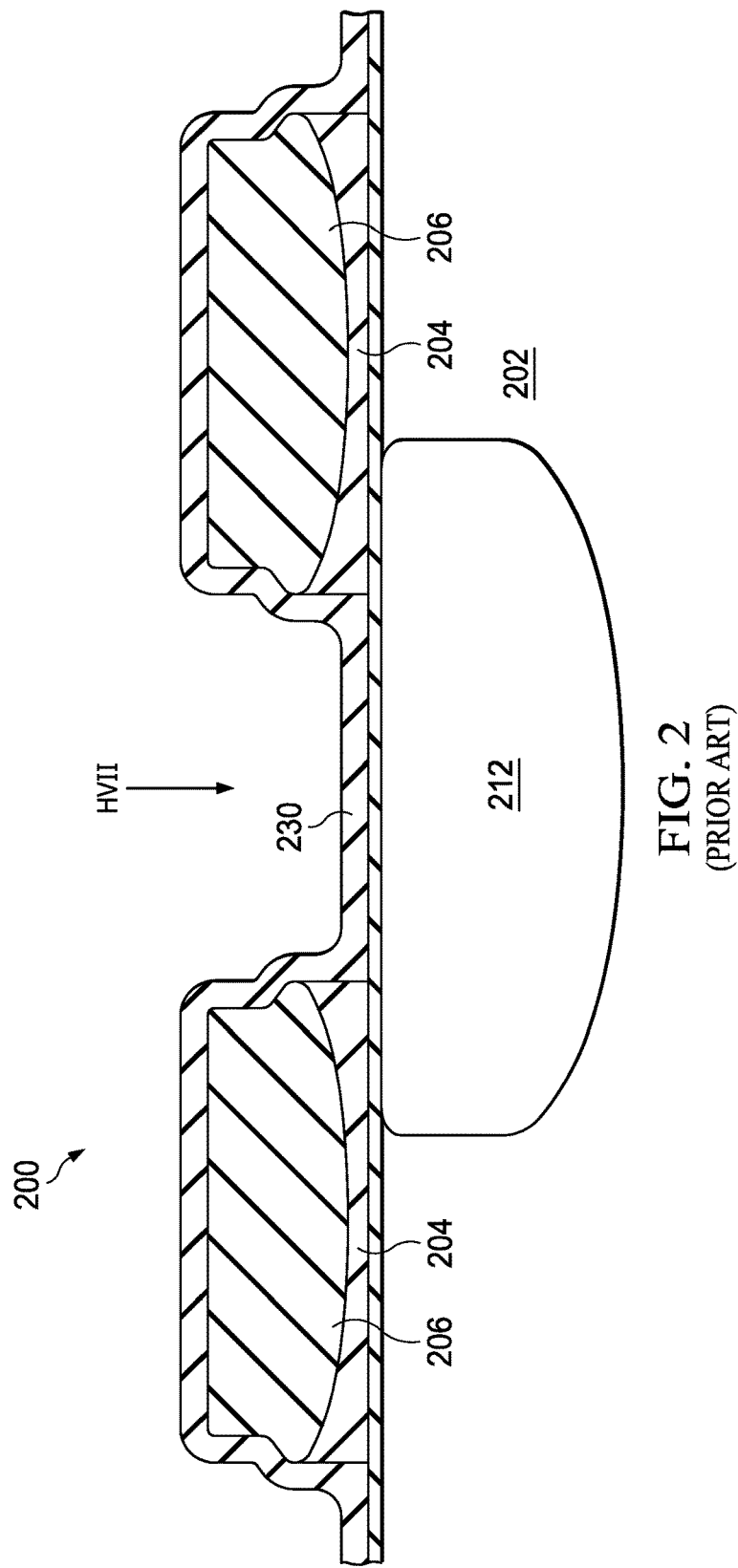
FIG. 2 illustrates example flash memory cell structure (e.g., a SuperFlash cell structure) including a pair of flat-topped floating gates and a conformal spacer layer formed over the floating gates, wherein a source region is formed by a source implant delivered through the a portion of conformal spacer layer between the pair of floating gates and into the underlying substrate.
Figure 3:
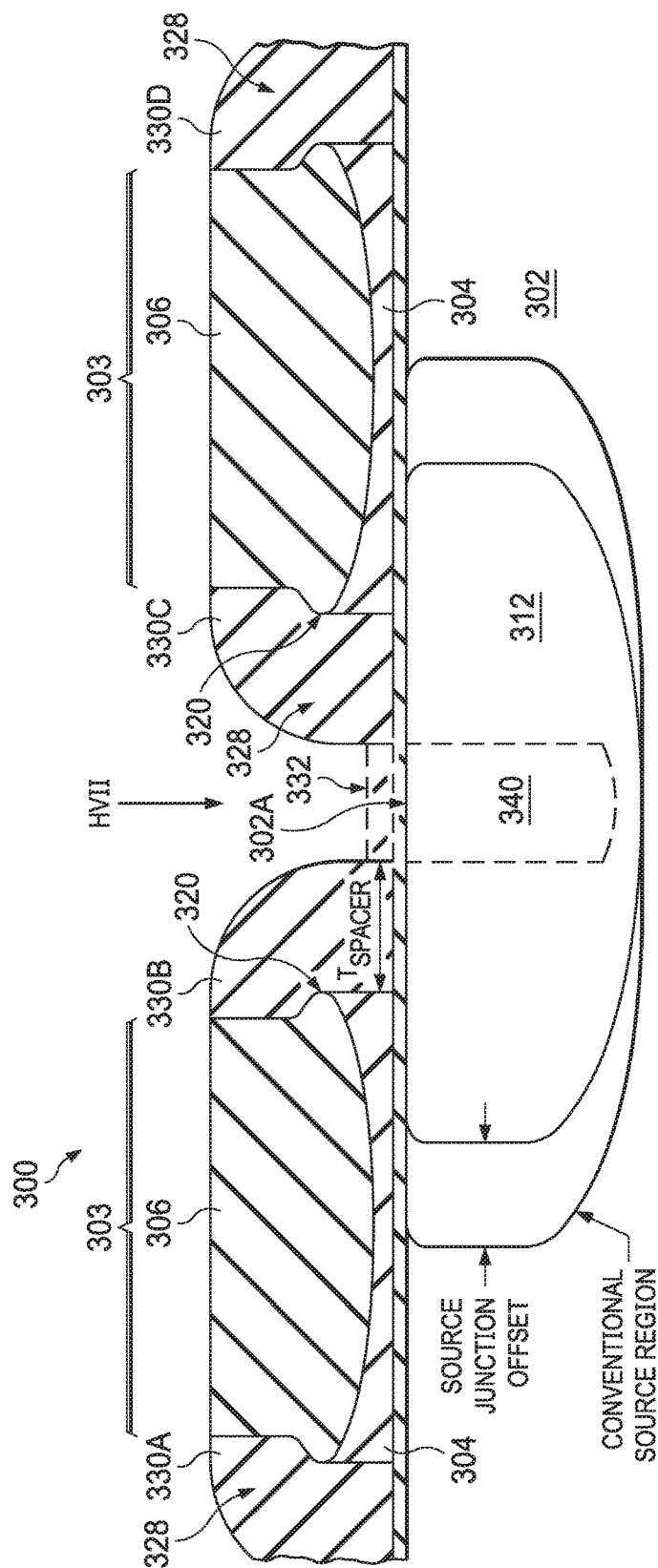
FIG. 3 illustrates example flash memory cell structure (e.g., a SuperFlash cell structure) including a pair of flat-topped floating gates and a non-conformal spacer layer formed over the floating gates, wherein a source region is formed by a source implant delivered through the space between non-conformal layer sidewalls between the pair of floating gates and into the underlying substrate, according to an example embodiment of the invention.

FIG. 3 shows an example technique for forming an example flash memory cell structure 300, which includes the use of a non-conformal floating gate spacer to regulate a location and lateral extent of the source region, according to an example embodiment. In the illustrated embodiment, a pair of floating gates 304 are formed over a substrate 302 using any suitable techniques. An oxide region or cap 306 may be formed over each floating gate 304. In the illustrated example, each oxide region 306 may comprise a flat-topped oxide cap formed over the floating gate 304, e.g., using the techniques disclosed in the attached co-pending U.S. application Ser. No. 15/921,858 filed Mar. 15, 2018, the entire contents of which application are hereby incorporated by reference. In other embodiments, floating gates 304 and oxide regions 306 may have any suitable shapes and may be formed using any suitable processing techniques.

Each floating gate 304 and overlying oxide region 306 may be collectively referred to as a "floating gate structure," indicated at 303. Thus, FIG. 3 shows a pair of example floating gate structures 303, each including a floating gate 304 and an overlying oxide region 306.

After forming the floating gate structures 303, a non-conformal spacer layer 328 may be formed over the structure using any suitable techniques. For example, the non-conformal spacer layer 328 may be formed by a two-step process including depositing a spacer layer (e.g., a conformal layer of nitride) over the structure, and then etching or otherwise removing portions of the spacer layer to define a non-conformal layer. In some embodiments, e.g., as shown in FIG. 3, the spacer layer may be etched to fully remove certain portions of the layer (e.g., horizontally extending portions), to thereby define spacer sidewall regions 330A-D adjacent the sidewalls of each floating gate structure 303 (or adjacent one or more selected floating gate sidewalls). Non-conformal spacer sidewall regions 330A-D may be separated from each other by areas free of spacer layer material. For example, as shown in FIG. 3, the spacer layer etch may fully remove an area of the spacer material between spacer sidewall regions 330B and 330C on adjacent sidewalls of the two floating gates 303. The full removal of the spacer layer material in this area may expose a top surface 302A of the substrate 302, or may expose an ONO layer or other layer formed over the substrate 302. In other embodiments, the spacer layer etch may remove only a partial thickness of the spacer layer 328 in this area, to define a reduced-thickness spacer layer area 332 over the substrate 302 in the area between spacer sidewall regions 330B and 330C.

The thickness of the deposited spacer layer and/or etching processes may be selected to control the lateral thickness at the base of each spacer sidewall region, indicated as $T_{spacer}$. In some embodiments, the deposited spacer layer may have a thickness of at least 1000 Å, or at least 1500 Å, or between 1000-2000 Å, or between 1300-1800 Å, or between 1500-1600 Å. In some embodiments, the lateral spacer sidewall thickness $T_{spacer}$ resulting from the etch process is less than the deposited spacer layer thickness, or less than 80% of the deposited spacer layer thickness, or less than 65% of the deposited spacer layer thickness, or less than 50% of the deposited spacer layer thickness, or between 25%-80% of the deposited spacer layer thickness, or between 40%-65% of the deposited spacer layer thickness. In some embodiments, the thickness of the deposited spacer layer and/or etching processes may be selected to provide spacer sidewall regions 330 having a lateral spacer sidewall thickness $T_{spacer}$ of between 500-1500 Å, or between 700-1300 Å, or between 800-1000 Å.

After forming the non-conformal spacer layer 328, a source implant may be performed to implant source dopant material to form a source implant region 340 in the substrate 302, using any suitable implant techniques, e.g., a vertically-aligned high voltage ion implant (HVII) of phosphorus. Spacer sidewall regions 330B and 330C may completely or substantially (e.g., at least 70%, at least 80%, at least 90%, or at least 95%) prevent penetration of the source implant material (e.g. phosphorus) through the spacer sidewall regions, such that source implant region 340 is self-aligned by spacer sidewall regions 330B and 330C. In addition, as shown in FIG. 3, spacer sidewall regions 330B and 330C may extend over the upper corners, or "tips" 320 of floating gates 306 (e.g., the source-side FG erase tips aligned over the source region) to prevent penetration of the dopant into the FG tips 320, which may prevent the undesirable dulling or rounding of the FG tips that occurs in certain conventional designs.

After the source implant process, the resulting source implant region 340 may subsequently be diffused laterally underneath the spacer sidewall regions 330B and 330C and partially underneath each floating gate 304. The lateral extent and width of the source implant region 340, and thus the resulting lateral location of each source junction edge of the diffused source region 312, may be controlled by the thickness of the spacer sidewall regions 330B and 330C that define the self-aligned edges of the source implant region 340. Thus, the lateral location of the source junction edges of the diffused source region 312 may be controlled, at least in part, by controlling the thickness of the spacer sidewall regions 330B and 330, which may be defined by the thickness of the deposited spacer layer 328 and subsequent etch processing. As shown in FIG. 3, the lateral width of the source region 312 may be reduced, as compared with a source region produced by prior known techniques, by a "source junction offset" distance, which may be proportional to the thickness of spacer sidewall regions 330B and 330.

In addition, due to the absence of spacer layer material (or reduced thickness of the spacer layer material) over the substrate 302 adjacent the spacer sidewall regions 330B and 330C (resulting from the etch process discussed above), the energy of the source implant process (e.g., HVII) may be reduced, e.g., as compared with a known process that implants through a conformal nitride spacer layer on the substrate.

As a result of the above, the source region formed according to the present invention may be selectively controlled, e.g., by controlling the thickness of the spacer sidewall regions and/or the energy level of the source implant, to reduce the distance to which the resulting source extends laterally under each floating gate.

FIG. 4 shows a graph of example source junction profile simulations for (a) a memory cell formed according to the techniques disclosed herein, including using a non-conformal spacer layer (and/or reduced implant energy) to control the lateral extent of the source region underneath the floating gate, indicated by curve 420, and (b) a memory cell formed according to prior known techniques, i.e., without using a non-conformal spacer layer (and/or using a higher implant energy), indicated by curve 410. For the memory cell formed according to the techniques disclosed herein, the simulation used a 1600 Å nitride spacer deposition and 1600 Å etch with 40% over-etch, which left a 90 nm foot at the bottom of each spacer sidewall.

As shown, the lateral source junction for the memory cell formed according to the present invention may be laterally offset from the source junction of the prior known memory cell, in the direction of extending less far under the respective floating gate. In this example, the lateral source junction according to the present invention is offset approximately 80 nm with respect to the lateral source junction according to prior known techniques.

Thus, the use of a non-conformal spacer as disclosed herein may (a) provide a lateral offset for an HVII implant for standard and EG shrunk cells, and (b) provide floating gate tip protection, e.g., in cells configured for EG erase. Thus, the disclosed invention may provide independent lateral control of the source junction edge location under the floating gate, which may be critical to hot carrier injection (HCI) programming, for example. Further, the disclosed invention may protect the floating gate tip from HVII doping, and subsequent rounding during oxidation.

The techniques disclosed herein may be applied to any suitable memory cell, e.g., any flash cells or cells including at least one floating gate, e.g., certain SuperFlash cells or other mirrored or split-gate flash memory cells.

The invention claimed is:

1. A method of forming a memory cell of a semiconductor device, the method comprising:
    forming a floating gate structure over a substrate;
    forming an oxide region over the floating gate structure, wherein the formation of the oxide region forms an upwardly-pointing floating gate tip region of the floating gate structure;
    forming a non-conformal spacer layer including a spacer sidewall region laterally adjacent a sidewall of the floating gate and extending over and covering the upwardly-pointing floating gate tip region such that a vertical plane passes through the spacer sidewall region and the floating late tip region; and
    performing a source implant into the substrate, wherein the spacer sidewall region laterally adjacent the sidewall of the floating gate and extending over and covering the upwardly-pointing floating gate tip region substantially prevents a vertical penetration of source implant material through the spacer sidewall region, to thereby (a) protect the upwardly-pointing floating gate tip region from receiving the source implant material and (b) define a self-aligned source implant region in the substrate.

2. The method of claim 1, wherein forming a non-conformal spacer layer comprises:
    depositing a first spacer layer over the floating gate structure and over a region of the substrate laterally adjacent the floating gate structure; and
    etching the first spacer layer.

3. The method of claim 2, wherein etching the first spacer layer:
    (a) defines the spacer sidewall region laterally adjacent the sidewall of the floating gate structure, and
    (b) removes a full thickness of the first spacer layer over an area of the substrate laterally the adjacent spacer sidewall region.

4. The method of claim 2, wherein etching the first spacer layer:
    (a) defines the spacer sidewall region laterally adjacent the sidewall of the floating gate structure, and
    (b) partially removes a thickness of the first spacer layer over an area of the substrate laterally the adjacent spacer sidewall region to define a reduced-thickness spacer layer area laterally adjacent the spacer sidewall region.

5. The method of claim 2, wherein the deposited first spacer layer has a thickness of at least 1000 Å, or at least 1500 Å, or between 1000-2000 Å, or between 1300-1800 Å, or between 1500-1600 Å.

6. The method of claim 2, wherein the spacer sidewall region defined by the etch has a lateral width at a bottom of the spacer sidewall region of between 500-1500 Å, or between 700-1300 Å, or between 800-1000 Å.

7. The method of claim 2, wherein
    the first spacer layer is deposited with a spacer layer thickness; and
    the spacer sidewall region defined by the etch has a lateral width, at a bottom of the spacer sidewall region, that is less than the spacer layer thickness, or less than 80% of the spacer layer thickness, or less than 65% of the spacer layer thickness, or less than 50% of the spacer layer thickness, or between 25%-80% of the spacer layer thickness, or between 40%-65% of the spacer layer thickness.

8. The method of claim 1, wherein the source implant material implanted into the substrate diffuses laterally underneath a portion of the floating gate structure.

9. The method of claim 1, wherein the non-conformal spacer layer comprises nitride.

10. The method of claim 1, comprising:
forming first and second floating gate structures over the substrate;
forming a first oxide region over the first floating gate structure and a second oxide region over the second floating gate structure, wherein the formation of the first and second oxide regions forms a first upwardly-pointing floating gate tip region of the first floating gate structure and a second upwardly-pointing floating gate tip region of the second floating gate structure;
wherein the non-conformal spacer layer includes:
a first spacer sidewall region laterally adjacent a first sidewall of the first floating gate facing the second floating gate and extending over and covering the first upwardly-pointing floating gate tip region such that a first vertical plane passes through the spacer sidewall region and the floating gate tip region; and
a second spacer sidewall region laterally adjacent a second sidewall of the second floating gate facing the first floating gate and extending over and covering the second upwardly-pointing floating gate tip region such that a second vertical plane passes through the spacer sidewall region and the floating gate tip region; and
performing a source implant into the substrate, wherein the first and second spacer sidewall regions substantially prevent a vertical penetration of source implant material through the first and second spacer sidewall regions, to thereby (a) protect the first and second upwardly-pointing floating gate tip regions from receiving the source implant material and (b) define a self-aligned source implant region in the substrate laterally between the first and second floating gates.

11. The method of claim 1, wherein the memory cell comprises a flash memory cell.

12. The method of claim 1, wherein the memory cell comprises a mirrored flash memory cell.

13. The method of claim 1, further comprising forming an erase gate adjacent the floating gate structure and overlapping the upwardly-pointing floating gate tip region.

14. The method of claim 1, further comprising forming a shared erase gate between the between the first and second floating gate structures and overlapping the first and second upwardly-pointing floating gate tip regions.

15. A method of forming a memory cell of a semiconductor device, the method comprising:
forming a floating gate structure over a substrate;
forming a non-conformal spacer layer by:
depositing a first material to form a continuous first spacer layer over the floating gate structure and over a region of the substrate laterally adjacent the floating gate structure; and
etching the first spacer layer formed of the first material to:
(a) define a spacer sidewall region of the first material laterally adjacent a sidewall of the floating gate structure and covering a portion of the floating gate structure such that a vertical plane passes through the spacer sidewall region and the floating gate structure, and
(b) partially remove a thickness of the first material over an area of the substrate laterally the adjacent spacer sidewall region to define a reduced-thickness spacer layer area laterally adjacent the spacer sidewall region; and
performing a source implant into the substrate, wherein the spacer sidewall region substantially prevents a vertical penetration of source implant material through the spacer sidewall region, to thereby define a self-aligned source implant region in the substrate.

16. A method of forming a memory cell of a semiconductor device, the method comprising:
forming first and second floating gate structures over a substrate;
forming a first oxide region over the first floating gate structure and a second oxide region over the second floating gate structure, wherein the formation of the first and second oxide regions forms a first upwardly-pointing floating gate tip region of the first floating gate structure and a second upwardly-pointing floating gate tip region of the second floating gate structure;
forming a non-conformal spacer layer including:
a first spacer sidewall region laterally adjacent a first sidewall of the first floating gate structure facing the second floating gate and extending over and covering the first upwardly-pointing floating gate tip region such that a first vertical plane passes through the spacer sidewall region and the floating gate tip region; and
a second spacer sidewall region laterally adjacent a second sidewall of the second floating gate structure facing the first floating gate and extending over and covering the second upwardly-pointing floating gate tip region such that a second vertical plane passes through the spacer sidewall region and the floating gate tip region; and
performing a source implant into the substrate, wherein the first and second spacer sidewall regions substantially prevent a vertical penetration of source implant material through the first and second spacer sidewall regions, to thereby (a) protect the first and second upwardly-pointing floating gate tip regions from receiving the source implant material and (b) define a self-aligned source implant region in the substrate laterally between the first and second floating gate structures.

\* \* \* \* \*